(12) United States Patent
Ko et al.

(10) Patent No.: US 9,975,134 B2
(45) Date of Patent: May 22, 2018

(54) DEPOSITION MASK AND METHOD OF MANUFACTURING THE SAME

(71) Applicant: SAMSUNG DISPLAY CO., LTD, Yongin, Gyeonggi-Do (KR)

(72) Inventors: Jung-Woo Ko, Yongin-Si (KR); Ikunori Kobayashi, Yongin-Si (KR)

(73) Assignee: Samsung Display Co., Ltd., Yongin-si (KR)

( * ) Notice: Subject to any disclaimer, the term of this patent is extended or adjusted under 35 U.S.C. 154(b) by 11 days.

(21) Appl. No.: 14/873,035

(22) Filed: Oct. 1, 2015

(65) Prior Publication Data

US 2016/0023230 A1 Jan. 28, 2016

Related U.S. Application Data

(62) Division of application No. 13/237,340, filed on Sep. 20, 2011.

(30) Foreign Application Priority Data

Mar. 15, 2011 (KR) .................. 10-2011-0023024

(51) Int. Cl.
*B05B 15/04* (2006.01)
*C23C 14/04* (2006.01)
(Continued)

(52) U.S. Cl.
CPC .......... *B05B 15/045* (2013.01); *B05C 21/005* (2013.01); *C23C 14/042* (2013.01);
(Continued)

(58) Field of Classification Search
None
See application file for complete search history.

(56) References Cited

U.S. PATENT DOCUMENTS 5,278,878 A 1/1994 Porowski
5,868,302 A * 2/1999 Onishi ................ B23K 3/0638
118/504
(Continued)

FOREIGN PATENT DOCUMENTS

EP 0666332 A1 8/1995
EP 0597244 B1 3/1997
(Continued)

OTHER PUBLICATIONS

Document "Tensile Weld" (freely obtained from the internet at website of http://www.kiswel.com/Data/Product/eng/TENSILE%20WELD.pdf.
"Progress in Low Transformation Temperature (LTT) Filler Wires: Review", G. Camet al., 63rd Annual Assembly & International Conference of the International Institute of Welding, Jul. 11-17, 2010, Istanbul, Turkey, pp. 759-765).

*Primary Examiner* — Jethro M Pence
(74) *Attorney, Agent, or Firm* — H.C. Park & Associates, PLC

(57) ABSTRACT

A deposition mask comprises a mask frame having an open window defined in a center thereof, a first mask sheet placed on the mask frame and including a plurality of open regions and a separation region which separates the open regions, and a second mask sheet placed on the first mask sheet and including a first aperture portion in a region which contacts the separation region of the first mask sheet.

10 Claims, 7 Drawing Sheets

(51) Int. Cl.
    *B05C 21/00*     (2006.01)
    *H01J 9/24*     (2006.01)
    *H01J 11/48*     (2012.01)
    *H01L 51/52*     (2006.01)

(52) U.S. Cl.
    CPC ............... *H01J 9/24* (2013.01); *H01J 11/48* (2013.01); *H01L 51/5246* (2013.01)

(56) References Cited

U.S. PATENT DOCUMENTS

| | | | |
|---|---|---|---|
| 6,162,566 | A | 12/2000 | Amemiya |
| 2004/0202821 | A1 | 10/2004 | Kim et al. |
| 2008/0018236 | A1 | 1/2008 | Arei et al. |
| 2010/0267227 | A1 | 10/2010 | Ko et al. |
| 2013/0064969 | A1* | 3/2013 | Inoue .................. C23C 14/042 |
| | | | 427/66 |

FOREIGN PATENT DOCUMENTS

| | | |
|---|---|---|
| JP | 2003-068454 | 3/2003 |
| JP | 2004-335382 | 11/2004 |
| KR | 10-0671975 | 1/2007 |
| KR | 10-0786843 | 12/2007 |
| KR | 10-2008-0000449 | 1/2008 |
| KR | 10-0908232 | 7/2009 |

* cited by examiner

DEPOSITION MASK AND METHOD OF MANUFACTURING THE SAME

CROSS-REFERENCE TO RELATED APPLICATIONS AND CLAIM OF PRIORITY

This application is filed pursuant to 35 U.S.C. § 121 as a Divisional of Applicant's patent application Ser. No. 13/237,340 previously filed in the U.S. Patent & Trademark Office on the 20 of Sep. 2011 (now abandoned). All benefits accruing under 35 U.S.C. § 120 from the parent application are also hereby claimed, and parent 13/237,340 is hereby incorporated by reference. This application also makes reference to, incorporates the same herein, and claims all benefits accruing under 35 U.S.C. § 119 from my application earlier filed in the Korean Intellectual Property Office on the 15 Mar. 2011 and there duly assigned Ser. No. 10-2011-0023024.

BACKGROUND OF THE INVENTION

Field of the Invention

The present invention relates to a deposition mask, and more particularly, to a deposition mask used in the manufacture of a display device.

Description of the Related Art

Electroluminescent elements, which are self-luminous display elements, are drawing attention as next-generation display elements due to their wide viewing angle, high contrast, and high response speed.

These electroluminescent elements are divided into inorganic electroluminescent elements and organic electroluminescent elements according to the material which forms a light-emitting layer. Organic electroluminescent elements have higher luminance and response speed than inorganic electroluminescent elements, and are capable of displaying color images. Due to these advantages, organic electroluminescent elements are being actively developed.

Display devices using organic electroluminescent elements are manufactured through various deposition processes, and a deposition mask is used in part of the manufacturing process. A deposition mask includes a mask frame and a mask sheet.

In the process of manufacturing a mask sheet, aperture portions may be formed by chemically etching a rolled metal plate. However, as the resolution of displays increases, apertures become smaller, and the gap between the apertures is reduced. Therefore, it is very difficult to manufacture a high-resolution mask using the chemical etching method.

To meet the demand for high-resolution displays, electroforming may be used in manufacturing a mask sheet. However, a mask sheet manufactured using electroforming is more deformed by heat than a conventional mask made of an Invar material. Therefore, the positions of apertures of the mask sheet may be changed by heat during a deposition process, and the deformation of the mask sheet due to heat may create deposition shadows, causing mask defects.

SUMMARY OF THE INVENTION

The present invention provides a deposition mask which is not deformed by heat and a method of manufacturing the deposition mask.

However, aspects of the present invention are not restricted to the ones set forth herein. The above and other aspects of the present invention will become more apparent to one of ordinary skill in the art to which the present invention pertains by referencing the detailed description of the present invention given below.

According to an aspect of the present invention, a deposition mask comprises a mask frame having an open window defined in a center thereof, a first mask sheet placed on the mask frame and comprising a plurality of open regions and a separation region which separates the open regions, and a second mask sheet placed on the first mask sheet and comprising a first aperture portion in a region which contacts the separation region of the first mask sheet.

According to another aspect of the present invention, a deposition mask comprises a mask frame having an open window defined in a center thereof, a mask sheet placed on the mask frame and comprising a plurality of aperture portions which comprise a first aperture portion and a second aperture portion, and a filler filling the first aperture portion.

According to an aspect of the present invention, a method of manufacturing a deposition mask comprises forming a mask frame having an open window defined in a center thereof, forming a first mask sheet which comprises a plurality of open regions and a separation region separating the open regions, placing the first mask sheet on the mask frame, forming a second mask sheet which comprises a first aperture portion, and placing the second mask sheet on the first mask sheet so that the first aperture portion of the second mask sheet contacts the separation region of the first mask sheet.

According to another aspect of the present invention, a method of manufacturing a deposition mask comprises forming a mask frame having an open window defined in a center thereof, forming a mask sheet comprising a plurality of aperture portions which comprise a first aperture portion and a second aperture portion, placing the mask sheet on the mask frame, and filling the first aperture portion of the mask sheet with a filler.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will now be described more fully with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will also be understood that, when a layer is referred to as being "on" another layer or substrate, it can be directly on the other layer or substrate, or intervening layers may also be present. In contrast, when an element is referred to as being "directly on" another element, there are no intervening elements present.

Figure 1:
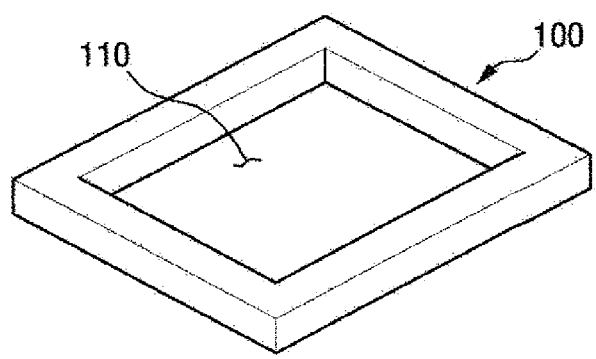
FIG. 1 is a perspective view of a mask frame according to an exemplary embodiment of the present invention.
Figure 2:
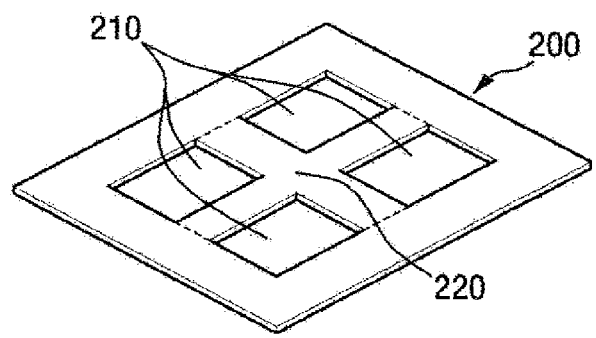
FIG. 2 is a perspective view of a first mask sheet according to an exemplary embodiment of the present invention.
Figure 3:
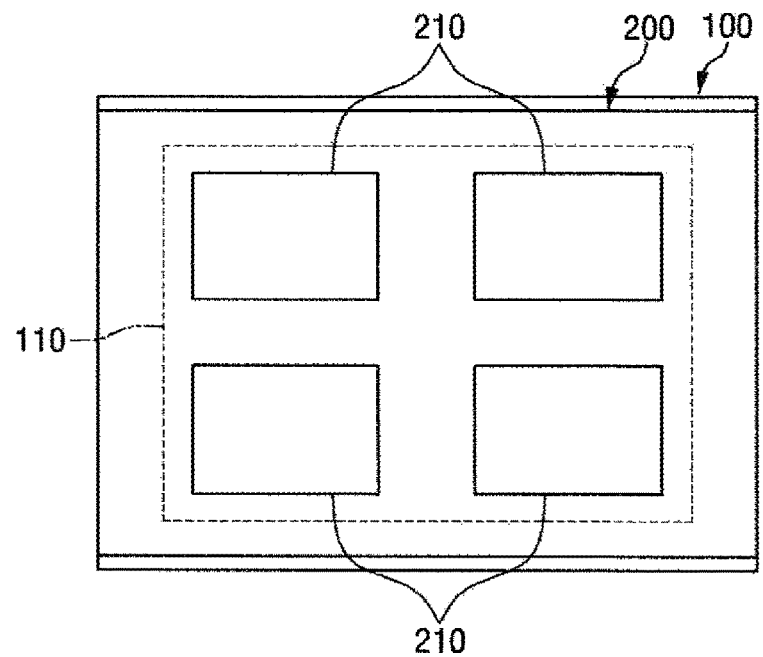
FIG. 3 is a plan view of the first mask sheet placed on the mask frame.
Figure 4:
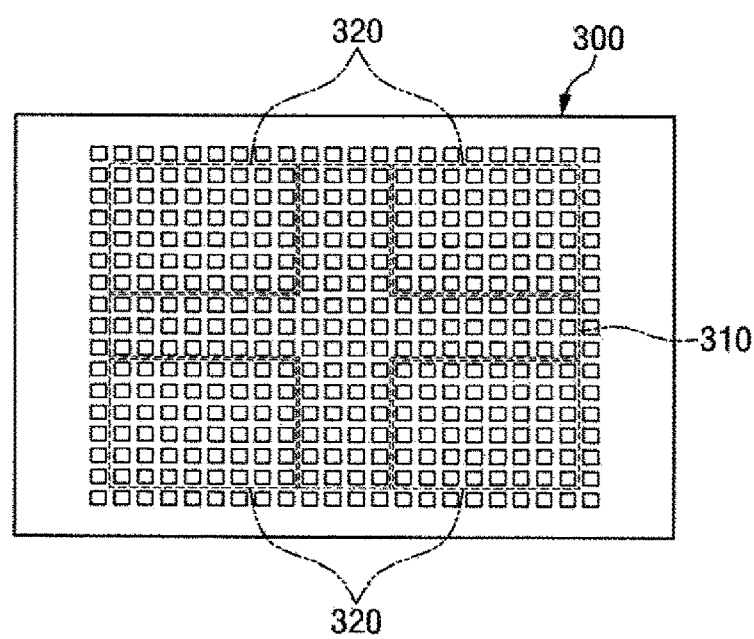
FIG. 4 is a plan view of a second mask sheet according to an exemplary embodiment of the present invention.
Figure 5:
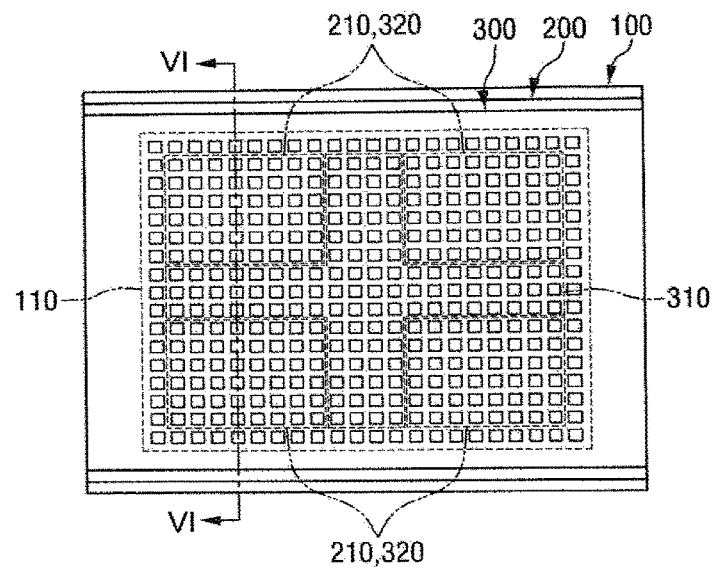
FIG. 5 is a plan view of a deposition mask according to an exemplary embodiment of the present invention.
Figure 6:
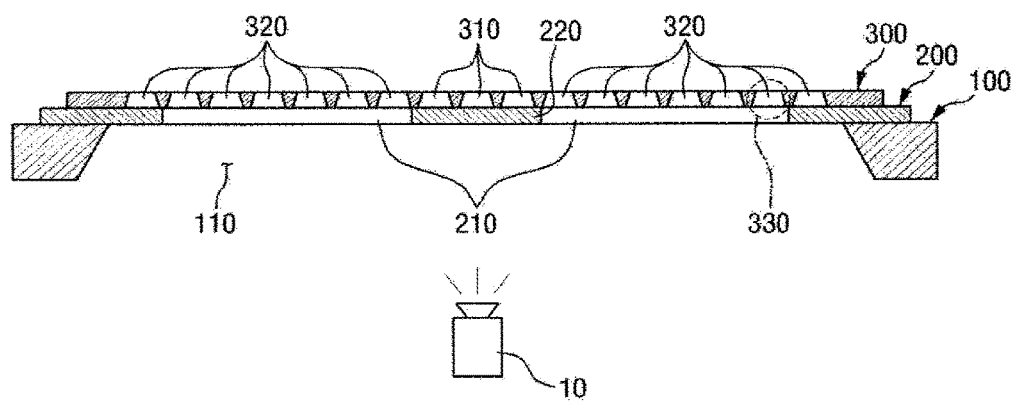
FIG. 6 is a cross-sectional view, taken along line VI-VI or FIG. 5, for explaining a deposition process.

FIG. 1 is a perspective view of a mask frame according to an exemplary embodiment of the present invention, FIG. 2 is a perspective view of a first mask sheet according to an exemplary embodiment of the present invention, FIG. 3 is a plan view of the first mask sheet placed on the mask frame, FIG. 4 is a plan view of a second mask sheet according to an exemplary embodiment of the present invention, FIG. 5 is a plan view of a deposition mask according to an exemplary embodiment of the present invention, and FIG. 6 is a cross-sectional view, taken along line VI-VI of FIG. 5, for explaining a deposition process.

Referring to FIGS. 1 thru 6, the deposition mask according to the current exemplary embodiment includes the mask frame 100, the first mask sheet 200 placed on the mask frame 100, and the second mask sheet 300 placed on the first mask sheet 200.

The mask frame 100 may have an open window 110 defined in the center thereof. For example, as shown in FIG. 1, the mask frame 100 may be shaped like a hollow hexagonal prism.

The first mask sheet 200 may be made of an Invar material which is an alloy having a low coefficient of thermal expansion.

The first mask sheet 200 may include a plurality of open regions 210 and a separation region 220 which separates the open regions 210.

As shown in FIG. 2, the open regions 210 may be arranged in a matrix form. In some embodiments, when the deposition mask is used to form an organic film of an organic light-emitting element, each of the open regions 210 may correspond to one display element. In this case, the separation region 220 may distinguish different display elements from each other.

The first mask sheet 200 may be placed on the mask frame 100. In this case, as shown in FIG. 3, the open regions 210 of the first mask sheet 200 may be placed on the window 110 of the mask frame 100.

The first mask sheet 200 may be fixed onto a surface of the mask frame 100. For example, the separation region 220 of the first mask sheet 200 may be tensile-welded onto the mask frame 100.

The second mask sheet 300 is placed on the first mask sheet 200. The second mask sheet 300 may be fixed onto a surface of the first mask sheet 200. In some embodiments, the second mask sheet 300 may be tensile-welded onto the first mask sheet 200.

The second mask sheet 300 may be a metal mask. For example, the second mask sheet 300 may be formed by electroforming. In some embodiments, the second mask sheet 300 may be formed by electroforming metal such as nickel.

The second mask sheet 300 includes one or more aperture portions. For example, the second mask sheet 300 may include a first aperture portion 310 and/or a second aperture portion 320.

The first aperture portion 310 and the second aperture portion 320 may be distinguished from each other by a region of the first mask sheet 200 which is overlapped by the second mask sheet 300. That is, the first aperture portion 310 may overlap the separation region 220 of the first mask sheet 200, and the second aperture portion 320 may overlap the open regions 210 of the first mask sheet 200.

In some embodiments, each of the first aperture portion 310 and the second aperture portion 320 may include a plurality of apertures. In some embodiments, all apertures including the apertures of the first aperture portion 310 and the apertures of the second aperture portion 320 may be evenly arranged in row and column directions of the second mask sheet 300.

The apertures of the first aperture portion 310 may have substantially the same shape as the apertures of the second aperture portion 320. In some embodiments, the apertures of the first aperture portion 310 and the apertures of the second aperture portion 320 may gradually increase in size toward the first mask sheet 200 with which the second mask sheet 300 is in contact, as indicated by reference numeral 330 in FIG. 6. In FIGS. 4 and 5, the apertures of the first aperture portion 310 and the apertures of the second aperture portion 320 are square. However, they can also be circular or slit-shaped.

As shown in FIG. 6, the second aperture portion 320 of the second mask sheet 300 is open to the window 110 of the mask frame 100 through the open regions 210 of the first mask sheet 200. On the other hand, the first aperture portion 310 of the second mask sheet 300 is not open to the window 110 of the mask frame 100 since it is placed on the separation region 220 of the first mask sheet 200. Therefore, while the second aperture portion 320 is used as a passage for depositing an organic material pattern, since an end of the first aperture portion 310 is closed by the separation region 220 of the first mask sheet 300, the first aperture portion 310 masks a deposition material during a deposition process.

More specifically, referring to FIG. 6, a source 10 may be placed under the mask frame 100 during a deposition process. In this regard, the source 10 may include an organic material used to form patterns on a substrate. When the organic material in the source 10 is heated, particles may evaporate and move toward the substrate. The particles can pass through the open regions 210 of the first mask sheet 200, but cannot pass through the separation region 220. The particles passing through the open regions 210 of the first mask sheet 200 travel through the second aperture portion 320 of the second mask sheet 300, and are then deposited on the substrate so as to form patterns. Therefore, predetermined patterns may be formed respectively on a number of display regions of the substrate equal to the number of the open regions 210.

The first aperture portion 310 of the second mask sheet 300 may contribute to preventing the deformation of the first mask sheet 200 and/or the second mask sheet 300. For example, since the separation region 220 of the first mask sheet 200 does not include apertures, if the first mask sheet 200 is tensile-welded to the mask frame 100, the separation region 220 is prone to thermal deformation since force applied to the separation region 220 per unit area is strong. However, if the first mask sheet 200 and the second mask sheet 300 are tensile-welded to each other in a state where the first aperture portion 310 of the second mask sheet 300 is placed on the separation region 220 of the first mask sheet 200, the first aperture portion 310 of the second mask sheet 300, together with the second aperture portion 320 of the second mask sheet 300, can offset expansion caused by heat generated during a deposition process.

If a deposition mask is designed using the mask frame 100, the first mask sheet 200, and the second mask sheet 300, as in the current exemplary embodiment, a model of a display can be changed in a simple way. That is, if a single mask sheet having a plurality of pattern portions which correspond respectively to the display regions is used, when the display model is changed, the entire design of the mask sheet must be changed. However, in the current exemplary embodiment, when the display model is changed, the second mask sheet 300 can be used without any modification, and only the structure of the first mask sheet 200 for distinguishing the display regions is modified. Therefore, a change in the display model requires only simple modifications. Accordingly, the cost of manufacturing a mask sheet based on a change in the display model can be reduced.

Figure 7:
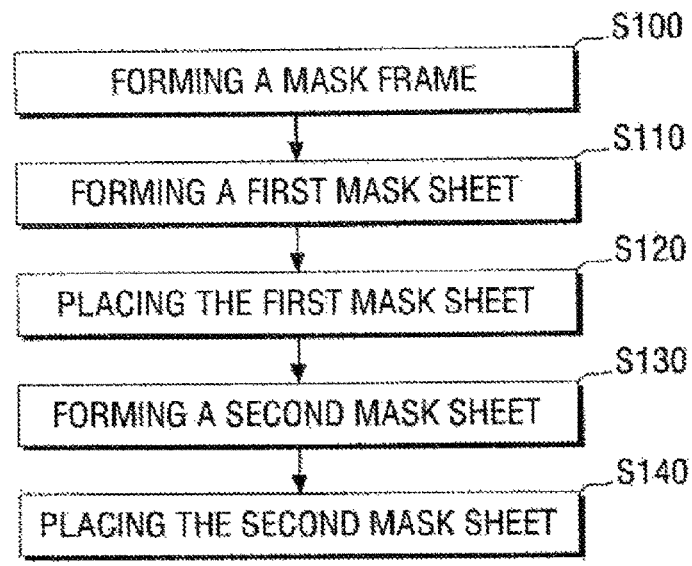
FIG. 7 is a flowchart illustrating a method of manufacturing a deposition mask according to an exemplary embodiment of the present invention.

FIG. 7 is a flowchart illustrating a method of manufacturing a deposition mask according to an exemplary embodiment of the present invention.

In the method of manufacturing a deposition mask according to the current exemplary embodiment, a mask frame having an open window defined in the center thereof is formed (operation S100). As described above, the mask frame may be shaped like a hollow hexagonal prism.

Next, a first mask sheet including a plurality of open regions and a separation region which separates the open regions is formed (operation S110). As described above, the first mask sheet may be made of an Invar material, which is an alloy having a low coefficient of thermal expansion. The open regions of the first mask sheet may be arranged in a matrix form.

The first mask sheet is placed on the mask frame (operation S120). As described above, the open regions of the first mask sheet may be placed on the window of the mask frame. In some embodiments, the placing of the first mask sheet on the mask frame may include tensile-welding the first mask sheet on the mask frame.

A second mask sheet is formed (operation S130) and is placed on the first mask sheet (operation S140). As described above, the second mask sheet may be formed by electroforming, specifically, by electroforming metal such as nickel. The second mask sheet may include a first aperture portion in a region which contacts the separation region of the first mask sheet. The second mask sheet may further include a second aperture portion which is placed on the open regions of the first mask sheet. All apertures, including apertures of ii the first aperture portion and apertures of the second aperture portion of the second mask sheet, may be evenly arranged in row and column directions of the second mask sheet.

Hereinafter, a deposition mask according to another exemplary embodiment of the present invention will be described.

Figure 8:
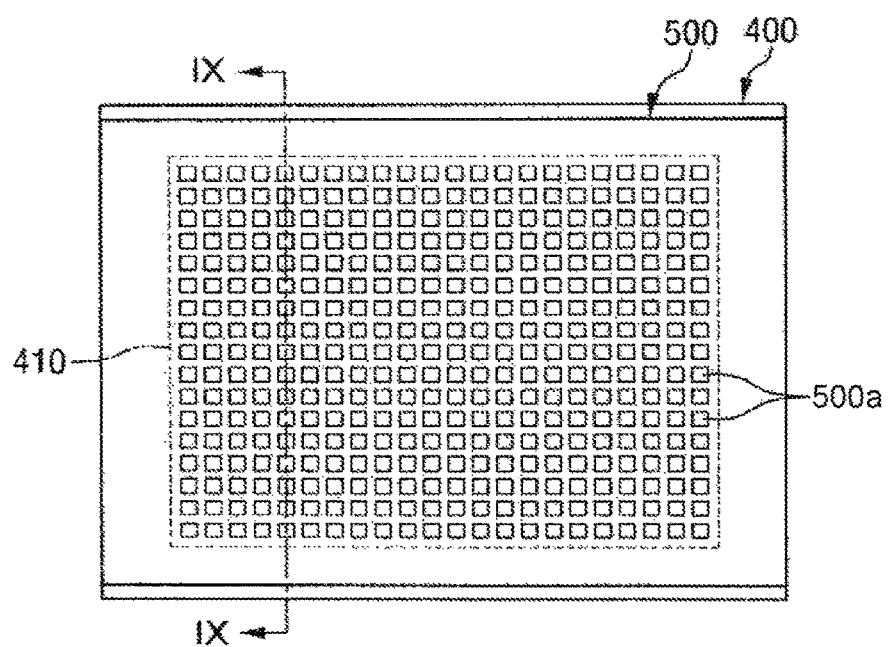
FIG. 8 is a plan view of a mask sheet placed on a mask frame according to another exemplary embodiment of the present invention.
Figure 9:
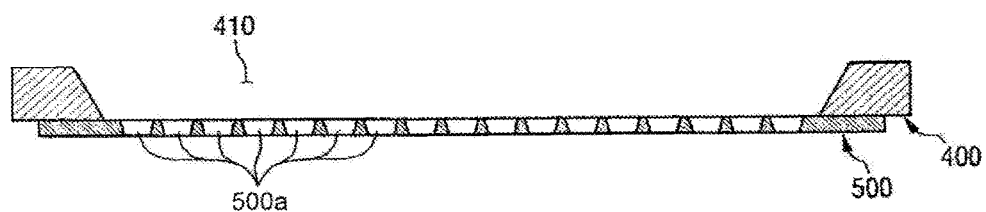
FIG. 9 is a cross-sectional view taken along the line IX-IX of FIG. 8.
Figure 10:
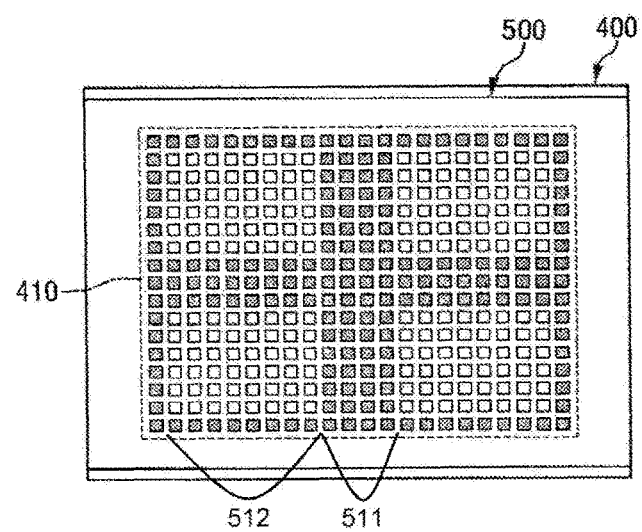
FIG. 10 is a plan view of a deposition mask according to another exemplary embodiment of the present invention.

FIG. 8 is a plan view of a mask sheet placed on a mask frame according to another exemplary embodiment of the present invention, FIG. 9 is a cross-sectional view taken along the line IX-IX of FIG. 8, and FIG. 10 is a plan view of a deposition mask according to another exemplary embodiment of the present invention.

Referring to FIGS. 8 thru 10, a deposition mask according to the current exemplary embodiment includes the mask frame 400 and the mask sheet 500. Specifically, referring to FIGS. 8 and 9, the deposition mask according to the current exemplary embodiment includes the mask frame 400, the mask sheet 500 placed on the mask frame 400, and a filler 520 which fills a first aperture portion 511 of the mask sheet 500.

The mask frame 400 is substantially identical to the mask frame 100 according to the exemplary embodiment of FIGS. 1 thru 6, and thus a repetitive description thereof will be omitted.

The mask sheet 500 includes a plurality of apertures 500a. The mask sheet 500 may be divided into a first aperture portion 511 and/or a second aperture portion 512. The second aperture portion 512 of the mask frame 500 may correspond to display regions of a substrate.

In some embodiments, each of the first aperture portion 511 and the second aperture portion 512 may include a plurality of apertures. The apertures 511a of the first aperture portion 511 may have substantially the same shape as the apertures 512a of the second aperture portion 512. The apertures 511a of the first aperture portion 511 and the apertures 512a of the second aperture portion 512 may have the same shape as the apertures of the first aperture portion 310 and the apertures of the second aperture portion 320, respectively, according to the exemplary embodiment of FIGS. 1 thru 6. Therefore, a detailed description of the shape of the apertures 511a and 512a of the first and second aperture portions 511 and 512, respectively, will be omitted.

Referring to FIG. 10, the mask sheet 500 may be placed on the mask frame 400. In this case, the first and second aperture portions 511 and 512 of the mask sheet 500 may be placed on a window 410 of the mask frame 400.

All apertures, including the apertures 511a of the first aperture portion 511 and the apertures 512a of the second aperture portion 512, may be evenly arranged in row and column directions of the mask sheet 500. After the apertures 511a of the first aperture portion 511 are filled, the second aperture portion 512 may form a plurality of pattern regions. In some embodiments, the pattern regions may be arranged in a matrix form.

The mask sheet 500 may be fixed onto a surface of the mask frame 400. For example, the mask sheet 500 may be tensile-welded onto the mask frame 400.

The mask sheet 500 may be a metal mask. For example, the mask sheet 500 may be formed by electroforming. In some embodiments, the mask sheet 500 may be formed by electroforming metal, such as nickel.

Figure 11:
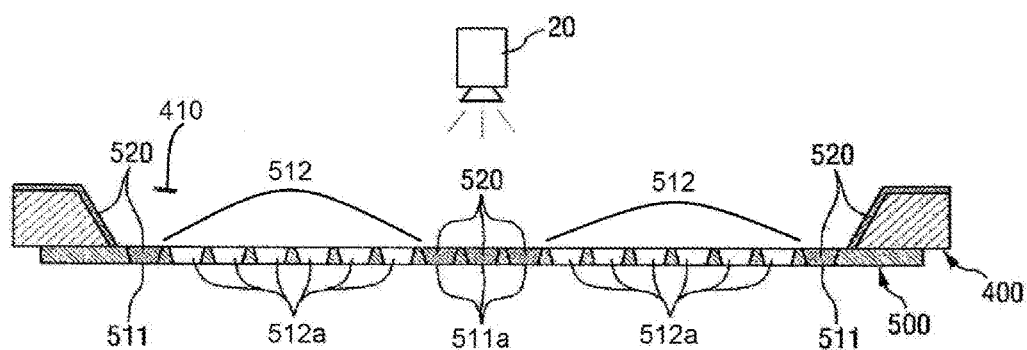
FIG. 11 is a cross-sectional view of the deposition mask.

FIG. 11 is a cross-sectional view of the deposition mask.

Referring to FIG. 11, the deposition mask according to the current exemplary embodiment may include the filler 520 which fills the apertures 511a of the first aperture portion 511 of the mask sheet 500. The filler 520 may fill all apertures 511a of the first aperture portion 511. In this regard, filling apertures 511a with the filler 520 may denote blocking apertures 511a by closing the apertures 511a with the filler 520. As a result, filler 520 is arranged within and completely fills apertures 511a of first aperture portion 511 so that deposition material cannot pass through apertures 511a of first aperture portion and reach the substrate. In some embodiments, an upper end of the filler 520 may be at the same level as (i.e. flush with) an upper end of the mask sheet 500, and a lower end of the filler 520 may be at the same level as (i.e. flush with) a lower end of the mask sheet 500. Furthermore, if the distinction between the filler 520 and the mask sheet 500 around the filler 520 is ignored, the filler 520 and the mask sheet 500 around the filler 520 may have substantially the same shape as the separation region 220 of the mask sheet 200 of FIG. 1.

The filler 520 may be formed by electroforming. In some embodiments, the filler 520 may be formed by electroforming metal, such as nickel. In some embodiments, the filler 520 may be made of the same material as the mask sheet 500.

As shown in FIG. 11, apertures 512a within the second aperture portion 512 of the mask sheet 500 remain open to the window 410 of the mask frame 400. On the other hand, the apertures 511a within the first aperture portion 511 of the mask sheet 500 are not open to the window 410 of the mask frame 400 since they are filled with the filler 520. Therefore, while the apertures 512a within the second aperture portion 512 are used as a passage for depositing an organic material pattern on a substrate arranged on an opposite side of the mask sheet from the deposition source 20, since apertures 511a within the first aperture portion 511 are intentionally clogged and thus closed by the filler 520, the first aperture portion 511 masks deposition material during a deposition process.

More specifically, referring to FIG. 11, a source 20 may be placed above the mask frame 400 during a deposition process. In this regard, the source 20 may include an organic material used to form patterns on a substrate. When the organic material in the source 20 is heated, particles may evaporate and move toward the substrate. The particles pass through the open apertures 512a within second aperture portion 512 of the mask sheet 500, and are then deposited on the substrate to form patterns. Therefore, predetermined patterns may be formed respectively on display regions of the substrate equal in number to the number of apertures 512a within the second aperture portion 512.

Figure 12:
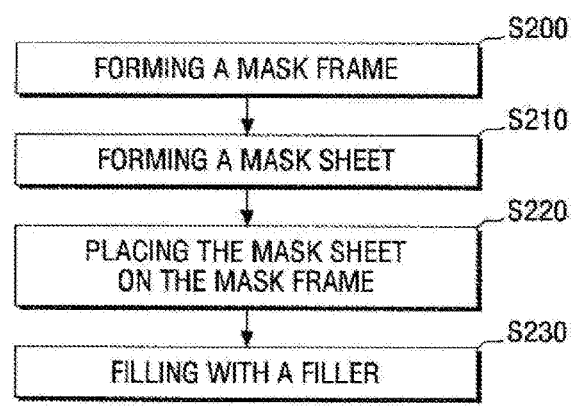
FIG. 12 is a flowchart illustrating a method of manufacturing a deposition mask according to another exemplary embodiment of the present invention.
Figure 13:
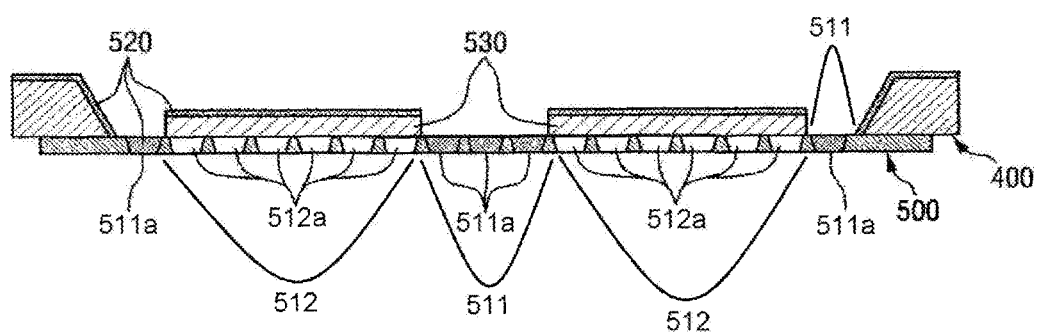
FIG. 13 is a cross-sectional view of the deposition mask.

FIG. 12 is a flowchart illustrating a method of manufacturing a deposition mask according to another exemplary embodiment of the present invention, and FIG. 13 is a cross-sectional view of the deposition mask.

In the method of manufacturing a deposition mask according to the current exemplary embodiment, a mask frame having an open window defined in the center thereof is formed (operation S200). As described above, the mask frame may be shaped like a hollow hexagonal prism.

Next, a mask sheet including a plurality of aperture portions is formed (operation S210). The aperture portions may include a first aperture portion and a second aperture portion. As described above, the mask sheet may be formed by electroforming.

The mask sheet is placed on the mask frame (operation S220). As described above, the aperture portions of the mask sheet may be placed on the window of the mask frame. In some embodiments, the placing of the mask sheet on the mask frame may include tensile-welding the mask sheet on the mask frame.

The first aperture portion of the mask sheet is filled with a filler (operation S230). The filling of the first aperture portion of the mask sheet with the filler will now be described in greater detail with reference to FIG. 13.

Referring to FIG. 13, a surface of the mask sheet 500 may face the window 410 of the mask frame 400 of FIG. 9, and a photosensitive layer 530 may be coated on regions of the surface of the mask sheet 500 which correspond respectively to the display regions. The photosensitive layer 530 may fill the apertures 512a within the second aperture portion 512 or may just be coated on the apertures 512a arranged within the second aperture portion 512.

The filler 520 may be formed on the mask sheet 500 coated with the photosensitive layer 530. The filler 520 may fill the apertures 511a arranged within the first aperture portion 511 of the mask sheet 500. In some embodiments, the filler 520 may be an electroformed layer.

Next, the photosensitive layer 530 formed on the mask sheet 500 may be removed. In some embodiments, the photosensitive layer 530 may be removed by exposure and development. When the photosensitive layer 530 is removed from the mask sheet 500, the apertures 512a arranged within the second aperture portion 512, which may have been filled with the photosensitive layer 530, may be open again. The open apertures 512a of the second aperture portion 512 may correspond to the display regions of the substrate.

As shown in FIG. 13, the apertures 512a within second aperture portion 512 of the mask sheet 500 are open to the window 410 of the mask frame 400 of FIG. 9. On the other hand, the apertures 511a arranged within the first aperture portion 511 of the mask sheet 500 are not open to the window 410 of the mask frame 400 of FIG. 9 since they are filled or clogged with the filler 520. Therefore, while the apertures 512a arranged within the second aperture portion 512 are used as a passage for depositing an organic material pattern, since the apertures 511a arranged within the first aperture portion 511 are closed and thus clogged with the filler 520, the first aperture portion 511 masks a deposition material during a deposition process.

The apertures 511a arranged within the first aperture portion 511 of the mask sheet 500 may contribute to preventing the deformation of the mask sheet 500. For example, if the mask sheet 500, including only the apertures 512a arranged within the second aperture portion 512 which corresponds to the display regions, is tensile-welded to the mask frame 400 of FIG. 9, a region of the mask sheet 500 in which the second aperture portion 512 is prone to thermal deformation since force applied to this region per unit area is strong. However, if apertures 511a are arranged within the first aperture portion 511 of the mask sheet 500, and if the mask sheet 500 is then tensile-welded to the mask frame 400, the first aperture portion 511 of the mask sheet 500 together with the second aperture portion 512 can offset expansion caused by heat generated during a deposition process.

If a deposition mask is designed using the mask frame 400 and the mask sheet 500 as in the current exemplary embodiment, a model of a display can be changed in a simple way. That is, if a single mask sheet having a plurality of pattern portions which correspond respectively to the display regions is used, when the display model is changed, the entire design of the mask sheet must be changed. However, in the current exemplary embodiment, when the display model is changed, the mask sheet 500 can be used without any modification, and only a filling method of the filler 520 for distinguishing the display regions is modified. Therefore, a change in the display model requires only simple modifications. Accordingly, the cost of manufacturing a mask sheet based on a change in the display model can be reduced.

Exemplary embodiments of the present invention provide at least one of the following advantages.

A mask sheet can be prevented from being deformed by heat during a deposition process. Accordingly, the creation of deposition shadows can be avoided, enabling the precise deposition of a material at intended locations, and thus realizing the production of high-resolution display products.

If resolution is the same, a change in a model of a display only requires modifications to the structure of an open mask sheet for distinguishing display regions, or to an aperture portion of the mask sheet which is filled with a filler.

Since the a change in the display model requires only simple modifications, the cost of manufacturing a mask sheet based on a change in the display model can be reduced.

However, the effects of the present invention are not restricted to the ones set forth herein. The above and other effects of the present invention will become more apparent to one of ordinary skill in the art to which the present invention pertains by referencing the claims.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A deposition mask, comprising:
a mask frame having an open deposition window;
a mask sheet placed on the mask frame to overlap the open deposition window and including a plurality of aperture portions which comprise a first aperture portion and a second aperture portion; and
a filler physically and internally filling an inside portion of the first aperture portion of the mask sheet,
wherein the mask sheet and the filler are formed of different materials.

2. The deposition mask of claim 1, wherein the first aperture portion comprises a plurality of apertures, and wherein the filler is arranged within and fills all of the apertures arranged within the first aperture portion.

3. The deposition mask of claim 1, wherein the second aperture portion includes a plurality of apertures, apertures of the second aperture portion form a plurality of pattern regions, and the pattern regions are arranged in a matrix form.

4. The deposition mask of claim 3, wherein the first aperture portion includes a plurality of apertures, and each aperture of the first aperture portion has a same shape as each aperture of the second aperture portion.

5. The deposition mask of claim 4, wherein all apertures, including the apertures of the first aperture portion and the apertures of the second aperture portion, are evenly arranged in row and column directions.

6. The deposition mask of claim 1, wherein the mask sheet is divided into a plurality of unit mask sheets.

7. The deposition mask of claim 1, wherein the mask sheet is undivided.

8. The deposition mask of claim 1, wherein the mask sheet is tensile-welded to the mask frame.

9. The deposition mask of claim 1, wherein none of the apertures arranged within the second aperture portion include the filler within, wherein the apertures within the second aperture portion are configured to allow for evaporated deposition material during a deposition process to pass therethrough to form a pattern on a substrate arranged on an opposite side of the deposition mask from a deposition source, while the filler blocks any deposition material from reaching the substrate at locations corresponding to the first aperture portion.

10. The deposition mask of claim 1, wherein each of the mask sheet and the filler are comprised of nickel, the mask sheet being tensile-welded to the mask frame.

* * * * *